(12) United States Patent
Wu et al.

(10) Patent No.: US 8,063,704 B2
(45) Date of Patent: Nov. 22, 2011

(54) GAIN ADJUSTMENT DEVICE AND METHOD THEREOF

(75) Inventors: Po-Chiang Wu, HsinChu (TW); Chung-Ting Yang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/547,148

(22) Filed: Aug. 25, 2009

(65) Prior Publication Data

US 2010/0045374 A1    Feb. 25, 2010

(30) Foreign Application Priority Data

Aug. 25, 2008   (TW) ............................... 97132388 A

(51) Int. Cl.
   *H03G 3/20*   (2006.01)
(52) U.S. Cl. ...................................... 330/279
(58) Field of Classification Search .................. 330/129, 330/279; 381/120
   See application file for complete search history.

(56) References Cited

U.S. PATENT DOCUMENTS 4,947,133 A * 8/1990 Thomas .................. 327/318
7,724,090 B2 * 5/2010 Lin et al. ................. 330/279

* cited by examiner

*Primary Examiner* — Steven J Mottola
(74) *Attorney, Agent, or Firm* — Thomas, Kayden, Horstemeyer & Risley, LLP

(57) ABSTRACT

A gain adjustment device and a method thereof are provided. The device includes a first processing module, a gain adjustment circuit, a second processing module, and a gain control module. The first processing module receives an input signal and generates a first signal. An operating voltage of the first processing module is a first voltage. The gain adjustment circuit receives the first signal and adjusts a gain of the first signal according to a gain control signal to output a third signal. The second processing module receives the third signal and generates a second signal. An operating voltage of the second processing module is a second voltage. The gain control module generates the gain control signal according to the first voltage and the second voltage.

18 Claims, 5 Drawing Sheets

US 8,063,704 B2

GAIN ADJUSTMENT DEVICE AND METHOD THEREOF

CROSS-REFERENCES TO RELATED APPLICATIONS

This non-provisional application claims priority under 35 U.S.C. §119(a) on Patent Application No. 97132388 filed in Taiwan, R.O.C. on Aug. 25, 2008, the entire contents of which are hereby incorporated by reference.

BACKGROUND

1. Technical Field

The disclosure relates to a gain adjustment device and a method thereof, and more particularly to an automatic gain adjustment device and a method thereof.

2. Related Art

Generally, an audio amplifier is employed to enable an audio system to output an audio signal with a large power. The audio amplifier requires a higher voltage in order to provide a larger output power. It is assumed that the voltage of an original audio signal is AVDD, and the voltage of an amplified audio signal output by the amplifier is SPKVDD, so that the original audio signal must be multiplied with a gain ratio (SPKVDD/AVDD), in order to avoid distortion or problems relating to an incorrect level of the audio signal. Conventionally, the gain ratio is set as a parameter, i.e., the gain ratio is a constant value, which may not be altered arbitrarily.

However, the voltage (SPKVDD) of the amplified audio signal output by the audio system does not always maintain a constant value. For example, in an ordinary handheld device, the power source of the audio amplifier is usually coupled to an output of the cell, and the voltage of the cell somewhat varies according to the electrical charge of the cell. Alternatively, when the handheld device is connected to a charger, the change of the power source system may also cause alterations of the SPKVDD. At this time, when the SPKVDD changes but the gain ratio fails to be adjusted accordingly, distortion and problems relating to an incorrect level of the audio signal may occur.

Therefore, a solution is needed urgently to eliminate the problems caused by the gain ratio in the audio system.

SUMMARY

Accordingly, the disclosure is directed to a gain adjustment device and a method thereof. By using the device and the method provided by the disclosure, a voltage gain is automatically adjusted according to a ratio of SPKVDD/AVDD. Therefore, a user does not need to set a voltage gain value, and the voltage gain can be automatically adjusted, so as to achieve a desired output power of the audio signal, without any distortion.

A gain adjustment device is provided in the disclosure, which includes a first processing module, a gain adjustment circuit, a second processing module, and a gain control module. The first processing module receives an input signal and generates a first signal, in which an operating voltage of the first processing module is a first voltage. The gain adjustment circuit receives the first signal, and adjusts a gain of the first signal according to a gain control signal to output a third signal. The second processing module receives the third signal to generate a second signal, in which an operating voltage of the second processing module is a second voltage. The gain control module generates the gain control signal according to the first voltage and the second voltage.

A gain adjustment method is also provided in the disclosure. The method includes: receiving a first signal from a first processing module, in which an operating voltage of the first processing module is a first voltage; adjusting a gain of the first signal according to a gain control signal to output a third signal; processing the third signal by a second processing module to generate a second signal, in which an operating voltage of the second processing module is a second voltage; and generating the gain control signal according to the first voltage and the second voltage.

A gain adjustment device is also provided in the disclosure, which is applicable to adjust a gain of a first signal. The device includes a voltage adjustment module, a voltage detection module, a control module, and a gain adjustment circuit. The voltage adjustment module receives a first voltage and a second voltage, and generates a first divided voltage corresponding to the first voltage and a second divided voltage corresponding to the second voltage according to an adjustment signal. The voltage detection module is coupled to the voltage adjustment module, and used for receiving the first divided voltage and the second divided voltage, and comparing the values of the first divided voltage and the second divided voltage to generate a detection signal. The control module is coupled to the voltage detection module, and used for generating a gain control signal according to the detection signal. The gain adjustment circuit adjusts the gain of the first signal according to the gain control signal to output a second signal.

A gain adjustment method is further provided in the disclosure, which is applicable to adjust a gain of a first signal. The method includes: receiving a second divided voltage corresponding to a second voltage; receiving a first divided voltage corresponding to a first voltage; generating a detection signal according to the values of the first divided voltage and the second divided voltage; generating a gain control signal according to the detection signal; and adjusting the gain of the first signal according to the gain control signal to output a second signal.

An output device is further provided in the disclosure, which includes a first signal processing module, a second signal processing module, an amplifier module, and a gain adjustment module. The first signal processing module generates a first signal. The second signal processing module processes a third signal to generate a second signal. The amplifier module having an adjustable voltage gain is coupled between the first signal processing module and the second signal processing module, and used for converting the first signal into the third signal. The gain adjustment module receives a first voltage and a second voltage, and generates a gain control signal according to the first voltage and the second voltage, so as to adjust the adjustable voltage gain.

Preferred embodiments and efficacies of the disclosure are illustrated in detail below with reference to the accompanying drawings.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
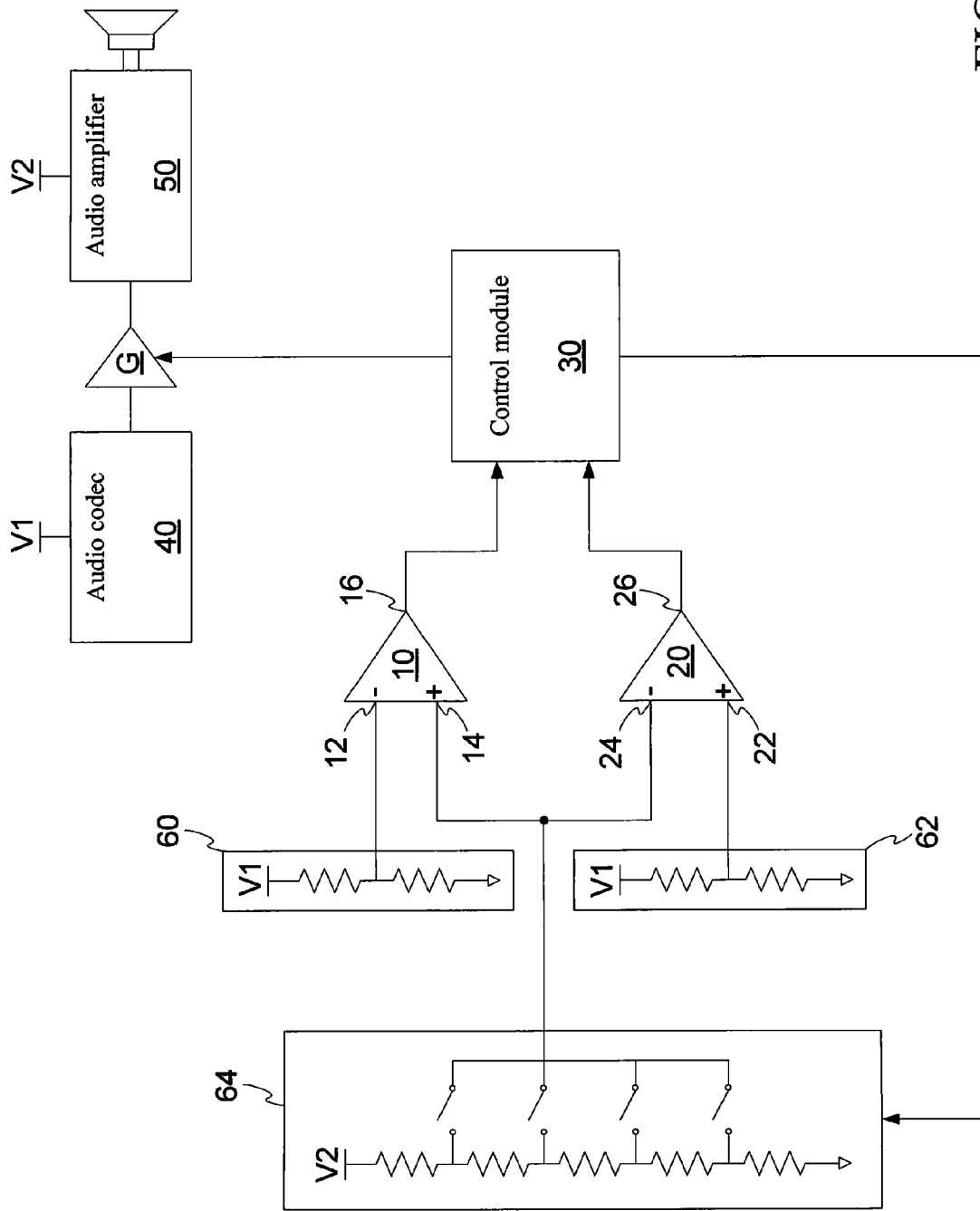
FIG. 1 is a schematic view of a gain adjustment device according to a first embodiment.

FIG. 1 is a schematic view of a gain adjustment device according to a first embodiment. The gain adjustment device of the disclosure adjusts a voltage gain required for converting a first signal into a second signal. The device includes a first comparator 10, a second comparator 20, a control module 30, a first resistance divider circuit 60, a second resistance divider circuit 62, and a third resistance divider circuit 64.

The first comparator 10 has a first input end 12, a second input end 14, and a first output end 16. The second comparator 20 has a third input end 22, a fourth input end 24, and a second output end 26.

The first resistance divider circuit 60 is coupled to the first input end 12 of the first comparator 10, and used for receiving a first voltage (V1) to generate a first divided voltage. Similarly, the second resistance divider circuit 62 is coupled to the third input end 22 of the second comparator 20, and used for receiving the first voltage to generate a second divided voltage. The first resistance divider circuit 60 and the second resistance divider circuit 62 divide the first voltage by using different resistances respectively, so as to obtain the first divided voltage and the second divided voltage with different values.

The third resistance divider circuit 64 is coupled to the second input end 14 of the first comparator 10 and the fourth input end 24 of the second comparator 20, and used for receiving a second voltage (V2) to generate a third divided voltage.

The first input end 12 receives the first divided voltage corresponding to a first voltage of the first signal, the second input end 14 receives the third divided voltage corresponding to the second voltage of the second signal, and the first output end 16 outputs a first comparison signal. The third input end 22 receives the second divided voltage corresponding to the first voltage, the fourth input end 24 receives the third divided voltage, and the second output end 26 outputs a second comparison signal.

The first signal is an original audio signal generated by an audio codec 40, and the first voltage is provided to the audio codec 40. On the other aspect, the second signal is an amplified audio signal generated by an audio amplifier 50, and the second voltage is provided to the audio amplifier 50.

The control module 30 is respectively coupled to the first output end 16 and the second output end 26, and used for receiving the first comparison signal and the second comparison signal to generate a divided voltage control signal. The control module 30 adjusts the value of the third divided voltage according to the divided voltage control signal, so as to enable the value of the third divided voltage to fall between the first divided voltage and the second divided voltage, and generates a gain control signal to adjust the voltage gain.

When the original audio signal generated by the audio codec 40 is amplified by the audio amplifier 50 to output the amplified audio signal, the above voltage gain is required between the audio codec 40 and the audio amplifier 50, so as to prevent the audio signal from distortion. In practice, a gain amplifier G is disposed between the audio codec 40 and the audio amplifier 50 to generate a voltage gain. Therefore, the gain control signal generated by the control module 30 is used for controlling the gain amplifier G to adjust the value of the voltage gain.

Referring to FIG. 1, the third resistance divider circuit 64 has a plurality of divider resistors and switches. When the control module 30 generates and transmits a divided voltage control signal to the third resistance divider circuit 64, the switches in the third resistance divider circuit 64 are turned on/off to adjust the value of the third divided voltage. The control module 30 adjusts the third resistance divider circuit 64 to enable the value of the third divided voltage to fall between the first divided voltage and the second divided voltage. Therefore, the voltage gain required for converting the first signal into the second signal is obtained, which may be illustrated in detail hereinafter.

Figure 2:
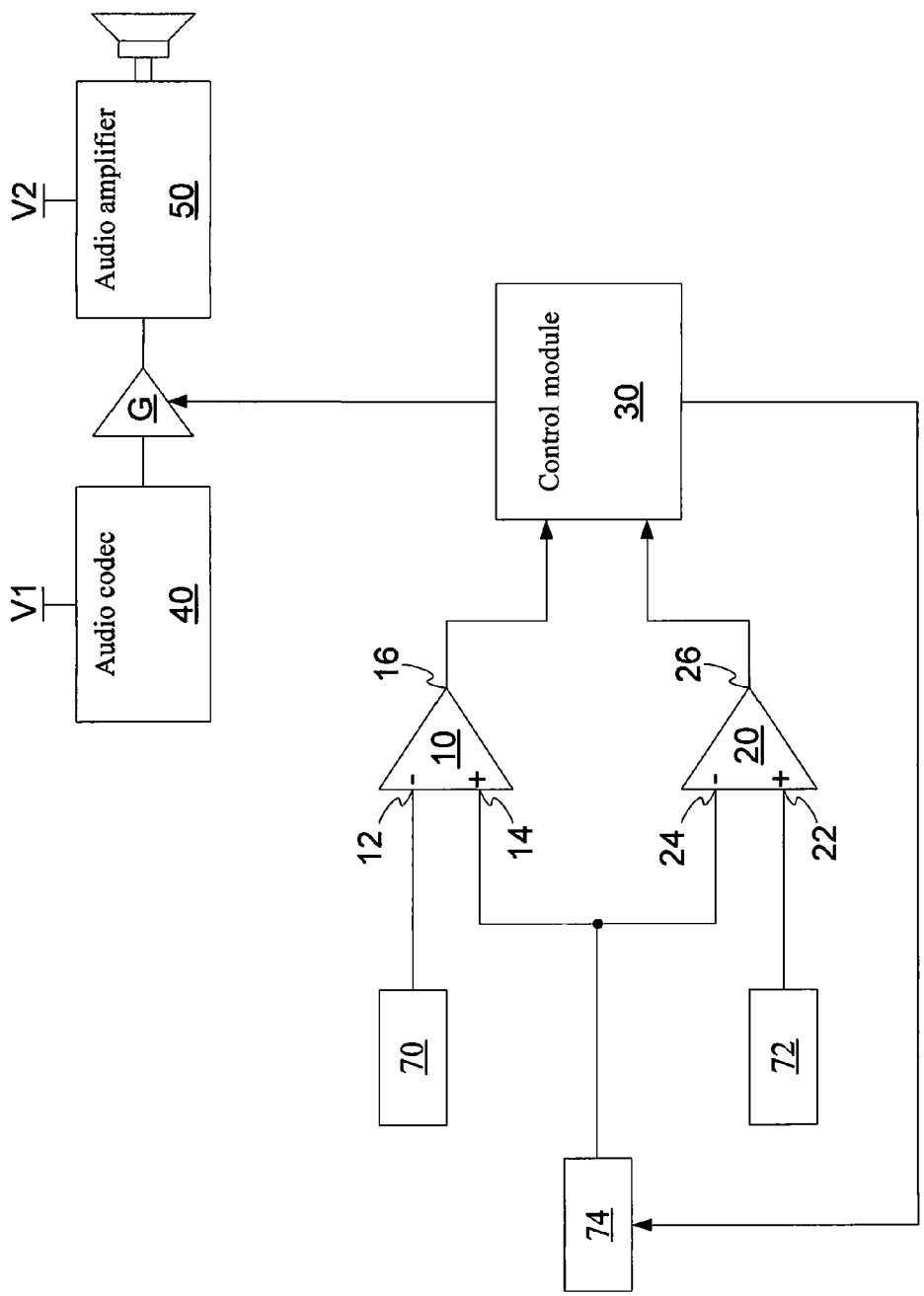
FIG. 2 is a schematic view of a gain adjustment device according to a second embodiment.

FIG. 2 is a schematic view of a gain adjustment device according to a second embodiment. In the above first embodiment, the different divided voltages are obtained in a resistance divider mode, that is, through an analog modulation mode. In contrast, the different divided voltages are obtained through a digital modulation mode in the second embodiment. In the second embodiment, a first analog-to-digital converter (ADC), 70 is adopted to replace the first resistance divider circuit 60 in FIG. 1, so as to generate the first divided voltage through the digital mode, and provide the first divided voltage to the first comparator 10. A second ADC 72 is adopted to replace the second resistance divider circuit 62 in FIG. 1, so as to generate the second divided voltage through the digital mode, and provide the second divided voltage to the second comparator 20. Furthermore, a third ADC 74 is adopted to replace the third resistance divider circuit 64 in FIG. 1, so as to generate the third divided voltage through the digital mode, and provide the third divided voltage to the first comparator 10 and the second comparator 20.

Here, the process of obtaining the voltage gain required for converting the first signal into the second signal by adjusting the third divided voltage to fall between the first divided voltage and the second divided voltage is illustrated as follows. An example is given below for illustration only, and the disclosure is not limited thereto. In a general audio system, the first voltage is 3.3 V, and the second voltage is 5 V or 12 V. In the disclosure, the first divided voltage and the second divided voltage are both constant, similar to two thresholds, and the third divided voltage is adjusted to fall between the two thresholds. It is assumed that the first divided voltage is 95% of the first voltage, i.e., the first divided voltage is 3.135 V; and the second divided voltage is 90% of the first voltage, i.e., the second divided voltage is 2.97 V. It is assumed that the second voltage is 5 V, and the third divided voltage is adjusted by the third resistance divider circuit 64 to be 64% of the second voltage, i.e., the third divided voltage is 3.2 V. As a result, the third divided voltage is larger than both the first divided voltage and the second divided voltage, and thus the third divided voltage must be backed through adjustment. Referring to FIG. 1, the third divided voltage is adjusted by the third resistance divider circuit 64 to be 58% of the second voltage, i.e., the third divided voltage is 2.9 V. Therefore, the third divided voltage is smaller than both the first divided voltage and the second divided voltage, and thus the third divided voltage must be boosted through adjustment. Finally, the third divided voltage is adjusted by the third resistance divider circuit 64 to be 62% of the second voltage, i.e., the third divided voltage is 3.1 V, which falls between the first divided voltage and the second divided voltage. At this time, the control module 30 determines when the second voltage is 5 V, the required voltage gain is about 1.61 (1/0.62), and then generates a gain control signal to adjust the gain amplifier G.

As mentioned in the prior art, the second voltage varies according to external factors (for example, the electrical charge of the cell). It is assumed that the second voltage drops from the initial 5 V to 4 V, and the required voltage gain should also be reduced to less than that required at 5 V. Similarly, the control module 30 generates a divided voltage control signal to adjust the value of the third divided voltage. For example, the third divided voltage is adjusted to become 77% of the second voltage, i.e., the third divided voltage is 3.08 V, which falls between the first divided voltage and the second divided voltage. At this time, the control module 30 determines that when the second voltage is 4 V, the required voltage gain is about 1.3 (1/0.77), and generates a gain control signal to adjust the gain amplifier G In view of the above, when the third divided voltage is adjusted to fall between the first divided voltage and the second divided voltage, the voltage gain required for converting the first signal into the second signal is obtained. In this manner, an automatic adjustment of the voltage gain is achieved. The first and second divided voltages may also be set by the user according to actual requirements.

Figure 3:
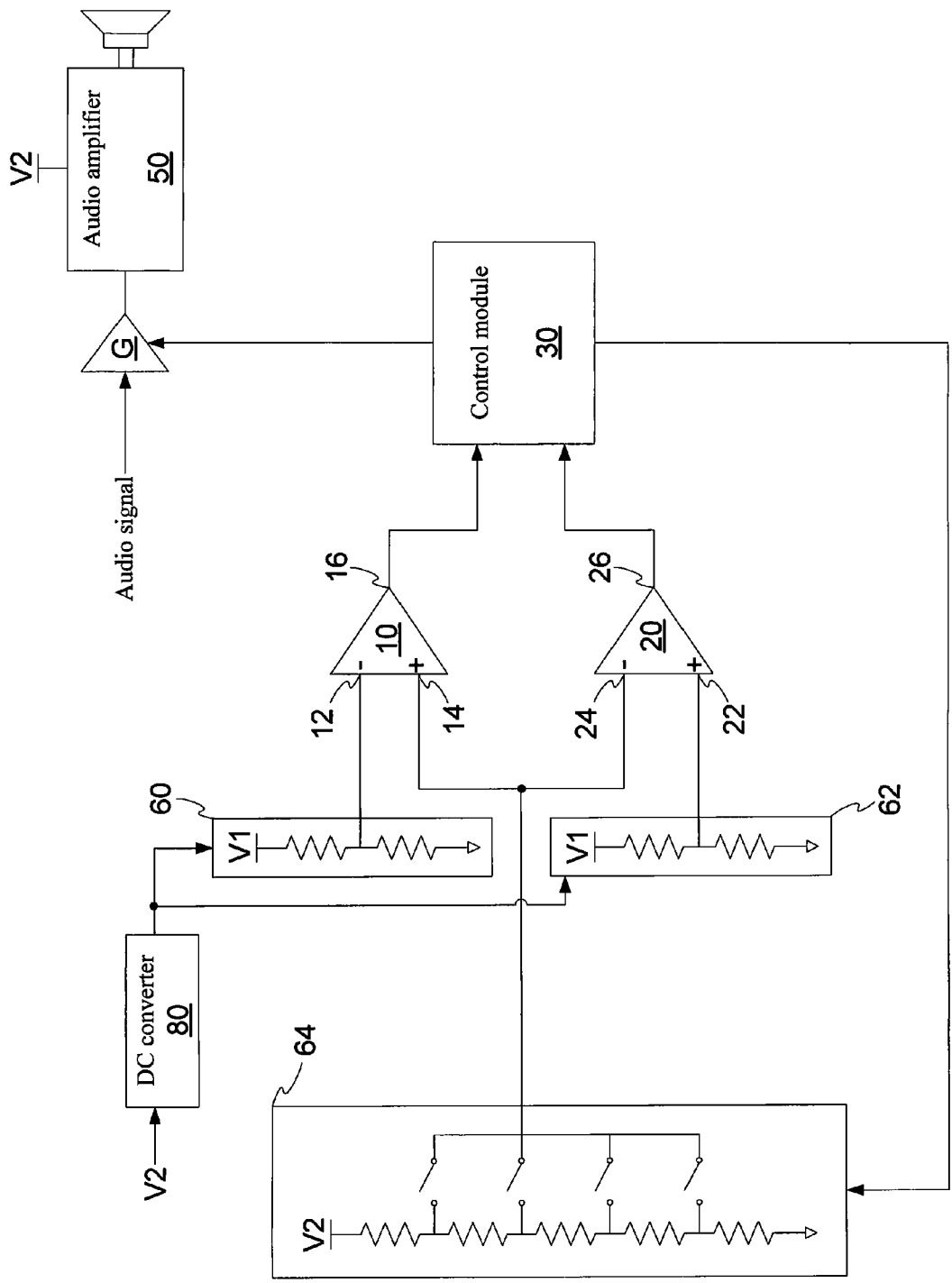
FIG. 3 is a schematic view of a gain adjustment device according to a third embodiment.

FIG. 3 is a schematic view of a gain adjustment device according to a third embodiment. The gain adjustment device of this embodiment further includes a direct current (DC/DC) converter 80.

In the third embodiment, the audio system does not have the audio codec 40, but only the audio amplifier 50. Therefore, an audio signal is directly transmitted to the audio amplifier 50 through the gain amplifier G, so that an internal power source of the gain adjustment device in this embodiment merely has a second voltage. In order to achieve the above automatic gain adjustment function, the third embodiment further includes a DC converter 80 for receiving the second voltage and converting the second voltage into the first voltage as mentioned in the above embodiments, so as to output the first voltage. As such, even if the audio system only has a single voltage, the voltage gain is automatically adjusted in real time when the second voltage changes can also be determined.

Figure 4:
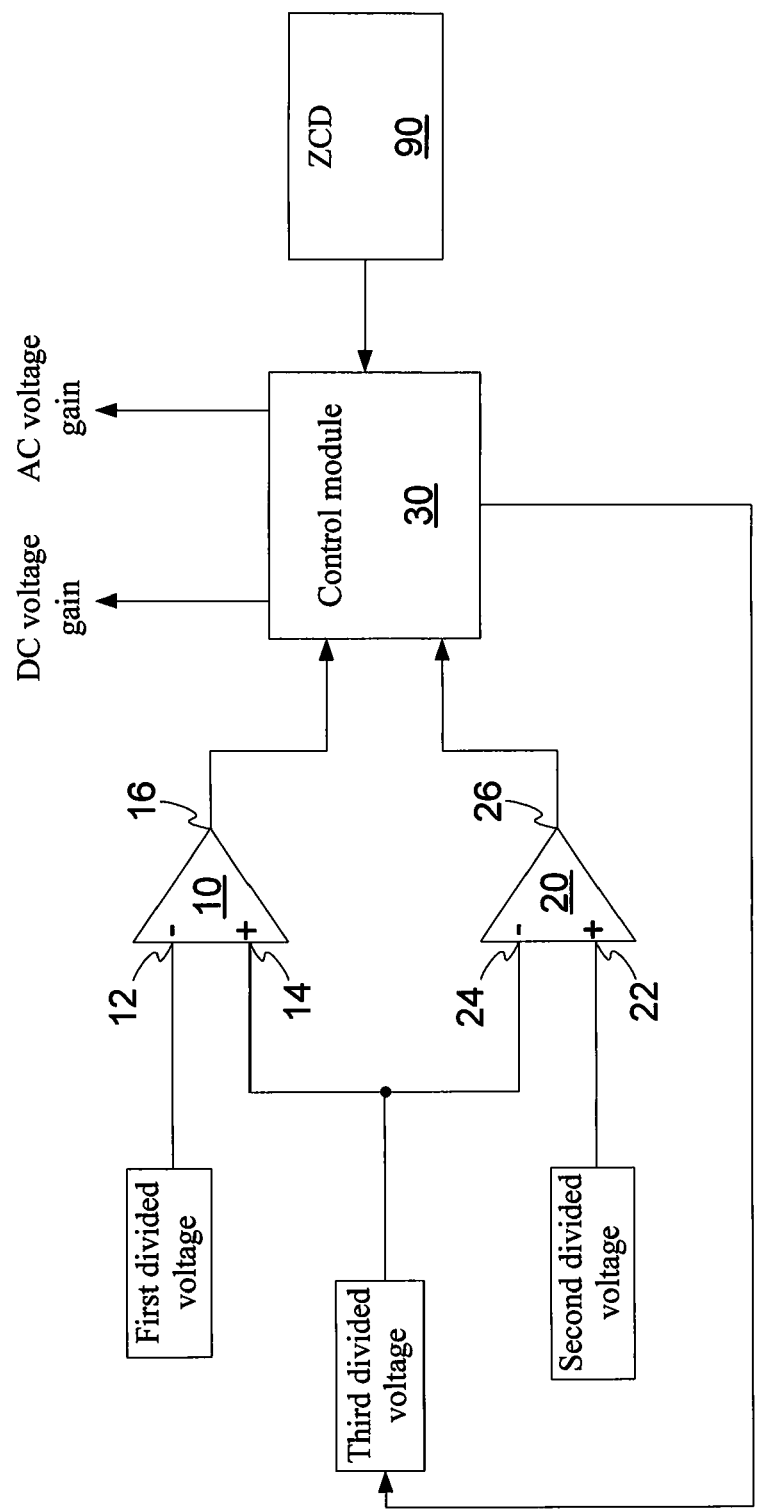
FIG. 4 is a schematic view of a gain adjustment device according to a fourth embodiment.

FIG. 4 is a schematic view of a gain adjustment device according to a fourth embodiment. Referring to FIG. 4, the voltage gain includes a DC voltage gain and an alternating current (AC) voltage gain. The DC voltage gain can be adjusted in real time by the control module 30. However, if the AC voltage gain is also adjusted in real time by the control module 30, popping noises may easily occur. Therefore, in this embodiment, the gain adjustment device further includes a zero crossing detector (ZCD) 90. The ZCD 90 is used for detecting a zero-crossing point of the first signal, and adjusting the AC voltage gain when the zero-crossing point of the first signal is detected. That is to say, the AC voltage gain varies after the zero-crossing point is detected, so that the popping noises generated during the voltage gain adjustment can be eliminated.

Figure 5:
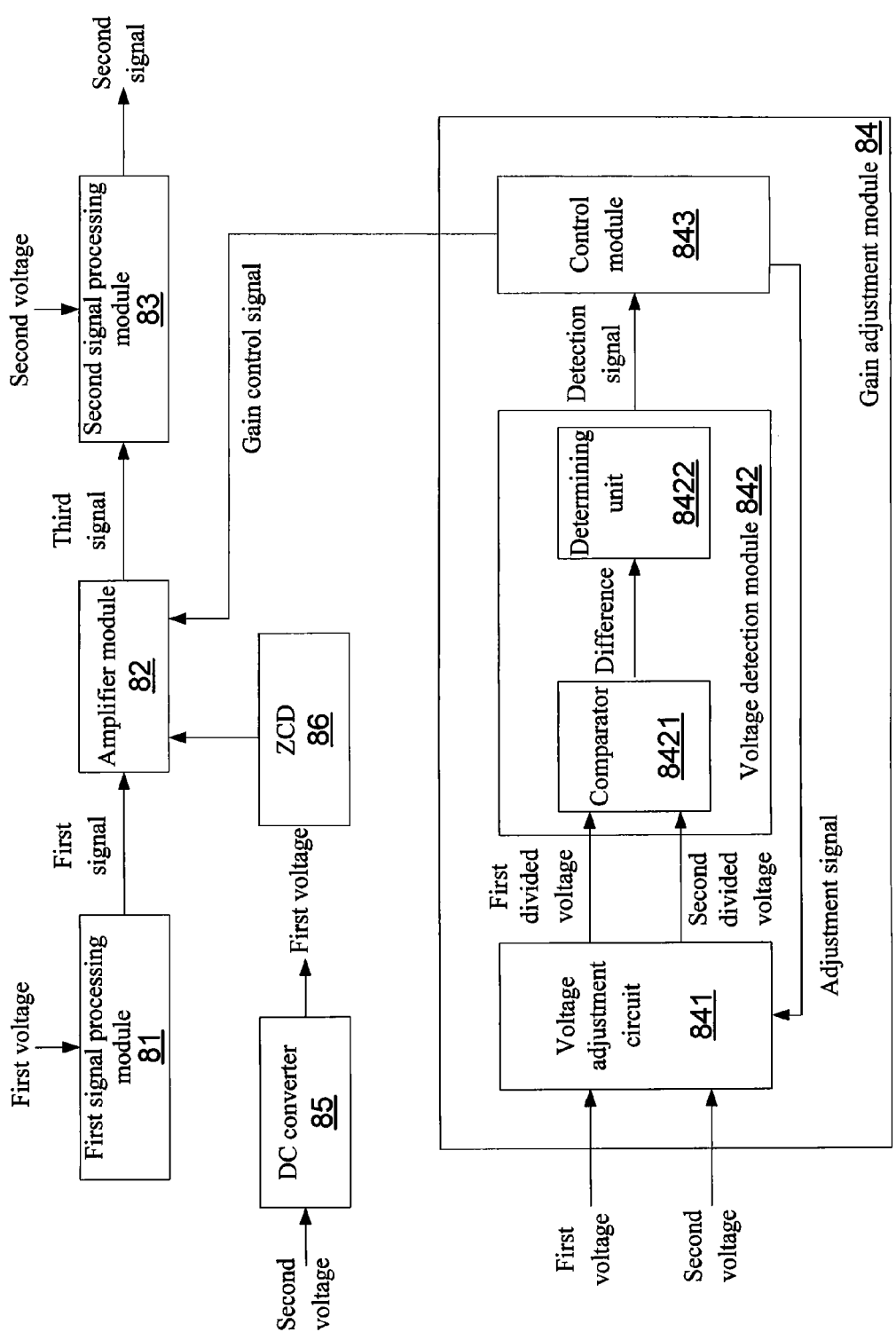
FIG. 5 is a schematic view of a gain adjustment device according to a fifth embodiment.

FIG. 5 is a schematic view of a gain adjustment device according to a fifth embodiment. In this embodiment, the gain adjustment device of the disclosure includes a first signal processing module 81, an amplifier module 82, a second signal processing module 83, a gain adjustment module 84, a DC converter 85, and a ZCD 86.

The first signal processing module 81 is used for processing an audio signal (for example, coding/decoding the signal), to generate a first signal. The amplifier module 82 having an adjustable voltage gain is used for receiving and amplifying the first signal (for example, raising a voltage level of the first signal to a voltage level of a third signal), and outputting a third signal. Afterwards, the second signal processing module 83 receives and amplifies the third signal to generate the second signal.

As mentioned in the above descriptions with reference to FIG. 1, in order to prevent the audio signal from distortion, the adjustable voltage gain in the amplifier module 82 must be adjusted according to a ratio between a voltage provided to the first signal processing module 81 (i.e., a first voltage), and a voltage provided to the second signal processing module 83 (i.e., a second voltage). The adjustable voltage gain is adjusted by the gain adjustment module 84. The first signal and the second signal are respectively corresponding to the first signal and the second signal in FIG. 1, and the third signal is an audio signal generated after the first signal is converted by the amplifier module 82.

The gain adjustment module 84 receives the first voltage and the second voltage, calculates a ratio between the first voltage and the second voltage, and generates a gain control signal to adjust the adjustable voltage gain in the amplifier module 82.

In addition, the gain adjustment module 84 further includes a voltage adjustment circuit 841, a voltage detection module 842, and a control module 843. The voltage adjustment circuit 841 is used for receiving the first voltage and the second voltage, and generating a first divided voltage corresponding to the first voltage and a second divided voltage corresponding to the second voltage respectively. The voltage detection module 842 is used for receiving the first divided voltage and the second divided voltage, and generating a detection signal according to a difference between the first divided voltage and the second divided voltage. The control module 843 is used for receiving the detection signal, and generating a gain adjustment signal. The implementation of this embodiment is illustrated in detail below.

First, the control module 843 has a preset ratio between the first voltage and the second voltage, and generates an adjustment signal according to the preset ratio, so as to notify the voltage adjustment circuit 841 of the proportions for dividing the first voltage and the second voltage. Then, the voltage adjustment circuit 841 divides the first voltage and the second voltage according to the adjustment signal, so as to generate a first divided voltage and a second divided voltage. The voltage detection module 842 further includes a comparator 8421 and a determining unit 8422. The comparator 8421 is used for receiving the first divided voltage and the second divided voltage, and generating a difference value between the first divided voltage and the second divided voltage. The determining unit 8422 has a preset value and is used for comparing the preset value with an absolute value of the difference value. If the absolute value of the difference is smaller than the preset value, it indicates that the preset ratio in the control module 843 is appropriate, and the control module 843 generates a gain adjustment signal accordingly. Conversely, if the absolute value of the difference is larger than the preset value, it indicates that the preset ratio in the control module 843 is inappropriate, and further needs to be adjusted. In this case, the control module 843 re-adjusts the preset ratio, and generates an adjustment signal to notify the voltage adjustment circuit 841 to perform a different voltage division. Meanwhile, the preset ratio is repeatedly adjusted through the above operations till the absolute value of the difference is smaller than the preset value and a gain adjustment signal is generated accordingly.

Certainly, the above preset ratio may be set in advance according to actual requirement, which is taken as an example for illustration only, and to which the disclosure is not limited. Furthermore, the DC converter 85 and the ZCD 86 in this embodiment are respectively similar to the DC converter 80 in FIG. 3 and the ZCD 90 in FIG. 4, so the implementations thereof are not described herein again.

While the present invention has been described by the way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A gain adjustment device, comprising:
    a first processing module, for receiving an input signal to generate a first signal, wherein an operating voltage of the first processing module is a first voltage;
    a gain adjustment circuit, for receiving the first signal, and adjusting a gain of the first signal according to a gain control signal to output a third signal;
    a second processing module, for receiving the third signal to generate a second signal, wherein an operating voltage of the second processing module is a second voltage; and
    a gain control module, for generating the gain control signal according to the first voltage and the second voltage.

2. The gain adjustment device according to claim 1, wherein the gain control module further comprises:
    a voltage detection module generating a detection signal according to values of the first voltage and the second voltage; and
    a control module, coupled to the voltage detection module, receiving the detection signal, and generating the gain control signal according to the detection signal.

3. The gain adjustment device according to claim 1, wherein the gain comprising a direct current voltage gain and an alternating current (AC) voltage gain.

4. The gain adjustment device according to claim 3, further comprising:
    a zero crossing detector (ZCD) detecting a zero-crossing point of the first signal, and adjusting the alternating current (AC) voltage gain.

5. The gain adjustment device according to claim 1, wherein the first processing module is an audio codec, and the first signal is an audio signal generated by the audio codec.

6. The gain adjustment device according to claim 1, wherein the second processing module is an audio amplifier, and the second signal is an amplified audio signal generated by the audio amplifier.

7. A gain adjustment method, comprising:
    receiving a first signal from a first processing module, wherein an operating voltage of the first processing module is a first voltage;
    adjusting a gain of the first signal according to a gain control signal to output a third signal;
    processing the third signal by a second processing module to generate a second signal, wherein an operating voltage of the second processing module is a second voltage; and
    generating the gain control signal according to the first voltage and the second voltage.

8. The method according to claim 7, wherein the step of generating the gain control signal further comprises: generating a detection signal according to values of the first voltage and the second voltage; and generating the gain control signal according to the detection signal.

9. The method according to claim 7, further comprising:
    detecting a zero-crossing point of the first signal, and adjusting an alternating current (AC) voltage gain of the gain.

10. An output device, comprising:
    a first signal processing module generating a first signal;
    a second signal processing module processing a third signal to generate a second signal;
    an amplifier module, having an adjustable voltage gain, coupled between the first signal processing module and the second signal processing module, and converting the first signal into the third signal;
    a gain adjustment module, receiving a first voltage and a second voltage, and generating a gain control signal according to the first voltage and the second voltage to adjust the adjustable voltage gain; and
    a zero crossing detector (ZCD), for detecting a zero-crossing point of the first signal, and adjusting an alternating current (AC) voltage gain of the adjustable voltage gain.

11. The output device according to claim 10, wherein the gain adjustment module further comprises:
    a voltage adjustment circuit, receiving the first voltage and the second voltage, and generating a first divided voltage corresponding to the first voltage and a second divided voltage corresponding to the second voltage according to an adjustment signal;
    a voltage detection module, coupled to the voltage adjustment circuit, receiving the first divided voltage and the second divided voltage, and generating a detection signal according to values of the first divided voltage and the second divided voltage; and
    a control module, coupled to the voltage detection module, receiving the detection signal, and generating the gain control signal according to the detection signal.

12. The output device according to claim 11, wherein the voltage detection module further comprises:
    a comparator, receiving the first divided voltage and the second divided voltage, and generating a difference between the first divided voltage and the second divided voltage; and
    a determining unit, coupled to the comparator, receiving the difference, and determining a value of the difference, so as to generate the detection signal according to the difference and a preset value,
    wherein when the difference is larger than the preset value, the detection signal is used for notifying the control module to generate the adjustment signal, and when the difference is smaller than the preset value, the detection signal is used for notifying the control module to generate the gain control signal.

13. The output device according to claim 10, wherein the gain comprising a direct current voltage gain and an alternating current voltage gain.

14. The output device according to claim 10, wherein the first signal processing module is an audio codec, the first signal is an audio signal generated by the audio codec, and the first voltage is a voltage provided to the audio codec.

15. The output device according to claim 10, wherein the second signal processing module is an audio amplifier, the second signal is an amplified audio signal generated by the audio amplifier, and the second voltage is a voltage provided to the audio amplifier.

16. An output device, comprising:
a first signal processing module generating a first signal;
a second signal processing module processing a third signal to generate a second signal;
an amplifier module, having an adjustable voltage gain, coupled between the first signal processing module and the second signal processing module, and converting the first signal into the third signal;
a gain adjustment module, receiving a first voltage and a second voltage, and generating a gain control signal according to the first voltage and the second voltage to adjust the adjustable voltage gain; and
a voltage adjustment circuit, receiving the first voltage and the second voltage, and generating a first divided voltage corresponding to the first voltage and a second divided voltage corresponding to the second voltage according to an adjustment signal.

17. The output device according to claim 16, further comprising a voltage detection module, coupled to the voltage adjustment circuit, receiving the first divided voltage and the second divided voltage, and generating a detection signal according to values of the first divided voltage and the second divided voltage.

18. The output device according to claim 17, further comprising a control module, coupled to the voltage detection module, receiving the detection signal, and generating the gain control signal according to the detection signal.

* * * * *